(12) United States Patent
Lyon (10) Patent No.: US 7,833,070 B2
(45) Date of Patent: Nov. 16, 2010

(54) ELECTRICAL CONNECTOR

(75) Inventor: Michael Lyon, Bickerstaffe (GB)

(73) Assignee: Pilkington Group Limited, St. Helens (GB)

( * ) Notice: Subject to any disclaimer, the term of this patent is extended or adjusted under 35 U.S.C. 154(b) by 110 days.

(21) Appl. No.: 12/294,204

(22) PCT Filed: Mar. 23, 2007

(86) PCT No.: PCT/GB2007/001066

§ 371 (c)(1),
(2), (4) Date: Sep. 23, 2008

(87) PCT Pub. No.: WO2007/110610

PCT Pub. Date: Oct. 4, 2007

(65) Prior Publication Data

US 2009/0233119 A1     Sep. 17, 2009

(30) Foreign Application Priority Data

Mar. 24, 2006   (GB) ................................. 0605884.6

(51) Int. Cl.
*H01R 4/02* (2006.01)
(52) U.S. Cl. .................... 439/874; 219/522; 228/124.1; 228/122.1
(58) Field of Classification Search ................. 439/874; 219/522; 228/124.1, 122.1
See application file for complete search history.

(56) References Cited

U.S. PATENT DOCUMENTS

| | | | |
|---|---|---|---|
| 3,173,737 A * | 3/1965 | Kinkaid et al. ............. 439/637 |
| 3,519,890 A * | 7/1970 | Ashby ........................ 361/776 |
| 3,634,654 A | 1/1972 | Peetz |
| 3,771,211 A | 11/1973 | Postupack |
| 3,842,189 A * | 10/1974 | Southgate .................... 174/547 |
| 4,023,008 A | 5/1977 | Durussel |
| 4,057,671 A | 11/1977 | Shoop |
| 4,246,467 A | 1/1981 | Boaz |
| 4,396,826 A | 8/1983 | Orcutt et al. |
| 4,758,407 A | 7/1988 | Ballentine et al. |

(Continued)

FOREIGN PATENT DOCUMENTS

EP    0 488 878 B1    6/1992

(Continued)

OTHER PUBLICATIONS

Search Report issued in corres. GB0605884.6, Jul. 20, 2006, The Patent Office, South Wales, UK.

(Continued)

*Primary Examiner*—Gary F. Paumen
(74) *Attorney, Agent, or Firm*—Buchanan Ingersoll & Rooney PC (57) ABSTRACT

An improved electrical connector for use with a glazing is disclosed. The glazing preferably comprises a ply of glazing material having a first electrically conductive component mounted thereon, and a second electrically conductive component, joined to the first by a lead-free solder. The second component has a thickness t and comprises first and second connector feet linked by a bridge portion, the bridge portion being at a height h above each of the connector feet. T and/or h are chosen to minimise the occurrence of stress faults in the glass in the region of the solder. Preferably, the glazing is an automotive glazing.

16 Claims, 7 Drawing Sheets

U.S. PATENT DOCUMENTS

| | | | |
|---|---|---|---|
| 5,368,814 | A | 11/1994 | Gonya et al. |
| 5,616,417 | A | 4/1997 | Ryan |
| 5,738,554 | A | 4/1998 | Borger et al. |
| 6,086,687 | A | 7/2000 | Oud et al. |
| 6,136,230 | A | 10/2000 | Sanada |
| 6,184,475 | B1 | 2/2001 | Kitajima et al. |
| 6,253,988 | B1 | 7/2001 | Pereira |
| 2002/0055282 | A1 | 5/2002 | Eldridge et al. |
| 2005/0112291 | A1 | 5/2005 | Okajima et al. |
| 2006/0240265 | A1 | 10/2006 | Cook et al. |
| 2009/0170380 | A1 | 7/2009 | Lyon |

FOREIGN PATENT DOCUMENTS

| | | |
|---|---|---|
| EP | 0 704 727 A1 | 4/1996 |
| EP | 0 612 577 B1 | 5/1997 |
| EP | 1 080 824 A1 | 3/2001 |
| EP | 1 106 301 A1 | 6/2001 |
| EP | 1 199 289 A1 | 4/2002 |
| EP | 1 256 261 B1 | 11/2002 |
| EP | 0 974 558 B1 | 1/2003 |
| EP | 1 488 972 B1 | 12/2004 |
| GB | 1163224 A | 9/1969 |
| GB | 2 357 638 A | 6/2001 |
| JP | 2000-119046 A | 4/2000 |
| WO | WO 2004/068643 A1 | 8/2004 |

OTHER PUBLICATIONS

International search Report (PCT/ISA/210).
International Preliminary Report on Patentability (PCT/IPEA/409).

* cited by examiner

ELECTRICAL CONNECTOR

The present invention relates to an electrical connector for an automotive glazing.

A variety of electrical connectors are used throughout the automotive glazing industry. For example, T-piece connectors may be used to connect an electrically conductive circuit, such as a circuit printed on the surface of a ply of glass, or an array of wires fixed within a laminated glazing, to the wiring harness of a vehicle. Such circuits generally find use as heating circuits, to promote de-misting or de-icing, or antenna circuits. The T-piece connector is soldered to an electrically conductive substrate known as a bus bar, which may be provided directly on the surface of a piece of glass, or fully or partly on a fired, printed band on the glass, known as an obscuration band. The bus bar is typically printed using a silver-containing ink. Traditionally, the solder used to join the bus bar and the connector contains lead. However, lead is known to be harmful, and there is increasing pressure to use lead-free solders in the automotive industry, for example, such as that described in WO2004/068643. WO2004/068643 discloses tin-based solders (up to 90% by weight tin), comprising a mechanical stress modifier selected from bismuth or indium. The solder may also contain silver and/or copper.

However, one disadvantage to using a lead-free solder is that the adhesion between the connector and the bus bar may not be as high as that given by a lead containing solder. One solution to this is to additionally use an adhesive to bear the mechanical load on the connector, as in EP 1 256 261. A further disadvantage is that although the adhesion between the connector and the bus bar is reduced, the stress in the surface of the glass in the region of the solder is increased. This can lead to increased faults due to stress fractures in the surface of the glass.

Two types of stress faults occur in glazings comprising having two electrically conductive components soldered together and mounted on one surface of the glazing. The first type of stress fault is where a fracture occurs, running approximately parallel to the glass surface, and causes an area of glass to be lifted out from the surface of the glazing. In toughened glass, the fault manifests itself as a small, visible defect resembling a blister in the black printed ink of the obscuration band. In a laminated glazing, the fault manifests itself as one or more cracks in the ply of the laminate on which the soldering has occurred. In both cases, the faults may be clearly visible, and lead to rejection of the glazing. The second type of fault occurs where a functional layer of silver-containing ink (a bus bar or heating/antenna circuit) is over-printed onto an obscuration band, which comprises a fired ceramic ink, and the adhesion of the solder between the connector and the silver-containing ink is reduced. Under the influence of stress, a small structural defect, such as a crack, can occur at the interface between the solder and the layer of silver-containing ink, leading to shear mode failure. The soldered joint between the connector and the layer of silver-containing ink becomes weakened to the extent that relatively small additional forces exerted on the connector may result in it becoming completely detached from the layer of silver-containing ink.

Such stress faults are more common in toughened glazing panes, where a lead-free solder having a high (greater than 50%) tin content is used (where the high tin content leads to an increase in the wettability of the solder during processing). The occurrence of such stress faults therefore causes problems in terms of both the quality and reliability of such glazings. Therefore, if the use of lead-free solders is to be continued, it is necessary to find a way of reducing the stress within the glass in the soldered regions.

The present invention aims to address these problems by providing a glazing comprising a ply of glazing material having a first electrically conductive component mounted thereon, and a second electrically conductive component, joined to the first by a lead-free solder, the second component having a thickness t and comprising first and second connector feet linked by a bridge portion, the bridge portion being at a height h above each of the connector feet, wherein t and/or h is chosen to minimise the occurrence of stress faults in the glass in the region of the solder.

By optimising the design of the connector by taking into account the factors of bridge height and connector thickness, it is possible to produce a connector which, results in a reduced stress within the surface of the glazing. When used with a lead-free solder, this reduced stress is similar or better than stress levels achieved using a standard electrical connector and a solder composition containing lead.

Preferably, t is in the range 0.1 mm to less than or equal to 1.0 mm. Preferably, h is in the range 1.0 mm to less than or equal to 5.0 mm. Preferably, t and h are chosen to minimise the occurrence of stress faults in the glass in the region of the solder.

Preferably, when the second electrically conductive component is mounted on a piece of flat glass, t and/or h is chosen such that the maximum stress achieved is less than or equal to 12 MPa.

The second electrically conductive component may be made of copper. The first electrically conductive component may be a busbar.

Preferably, the surface of the ply of glazing material is printed around its periphery with a fired ink band. At least part of the first electrical component may be provided on the fired-ink band.

The glazing material may be a ply of toughened glass, in which case the stress fault manifests itself as a blister in the fired-ink band and corresponding region of the glass.

The glazing may be a ply of annealed glass included in a laminate, in which case the stress fault manifests itself as one or more cracks therein.

The stress fault may manifest itself as a structural defect in the interface between the first electrically conductive component and the second electrically conductive component.

Preferably, the second electrically conductive component is a T-piece connector. Preferably, the solder is a lead-free solder. Preferably the glazing is an automotive glazing.

The invention will now be described by way of example only, and with reference to the accompanying drawings in which.

A variety of electrical connectors are used within the automotive glazing industry to connect circuitry provided on or within glazing panels with the wiring harness of a vehicle. A typical connector is known as a T-piece, and is generally in the shape of a "T", although other connectors, for example, J-shaped and strip-shaped connectors are known. Each type of connector has three features in common: two connector feet joined by a raised bridge portion; protrusions on the bottom of each connector foot; and each is formed from a thin strip or sheet of a metallic material, such as copper. However, it is also common to use connectors which do not have protrusions on the connector feet. Although the following examples are described in terms of T-pieces, the principles of the invention may be applied to all types of electrical connectors sharing these features.

Figure 1:
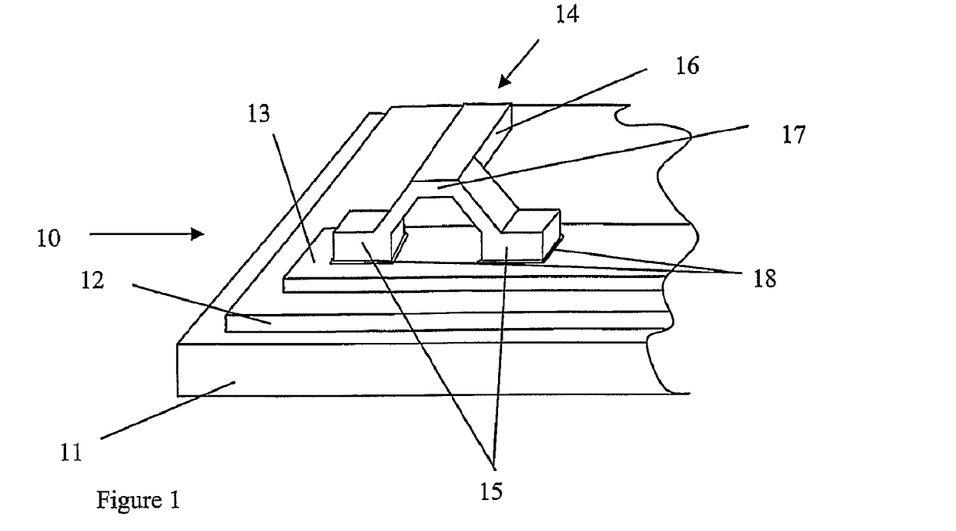
FIG. 1 is a perspective view (not to scale) of a glazing having an electrical connector mounted thereon.

FIG. 1 is a perspective view (not to scale) of an automotive glazing 10 having an electrical connector 14 soldered to an electrically conductive layer 13. The automotive glazing 10 comprises a sheet of glazing material 11, such as a ply of toughened glass, having a fired, black ceramic obscuration band 12 on one surface. An electrically conductive layer 13, known as a bus bar, is provided on the obscuration band 12, typically by printing the surface of the obscuration band 12 with an electrically conductive silver-containing ink. The obscuration band 12 is provided on glazings forming windscreens backlights and some rooflights, and may also be provided on glazings forming sidelights. In this case, the bus bar 13 is provided directly onto the surface of the glazing material 11.

An electrical connector 14 is mounted on the bus bar 13. The electrical connector 14 comprises a pair of connector feet 15, for attaching to the bus bar 13, and a connector arm 16, for attaching to the wiring harness of a vehicle in which the glazing is fitted. The connector feet 15 are linked together and joined to the connector arm 16 by a raised portion known as a bridge 17. Each of the connector feet 15 is attached to the glazing by means of a layer of solder 18, between each foot 15 and the bus bar 13.

Figure 2:
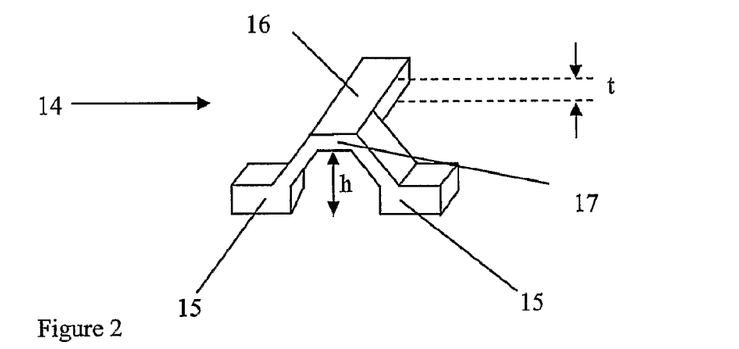
FIG. 2 is a perspective view (not to scale) of the electrical connector used in FIG. 1.

FIG. 2 is a perspective view (not to scale) showing the electrical connector 14 in more detail. The electrical connector 14 is formed from a thin strip or sheet of a metallic material, such as copper, having a thickness t. The bridge 17 is in a fixed position with respect to the connector feet 15 and connector arm 16, so that when the electrical connector 14 is soldered in place, the bridge 17 is at a height h above the base of the connector feet 15.

Figure 3:
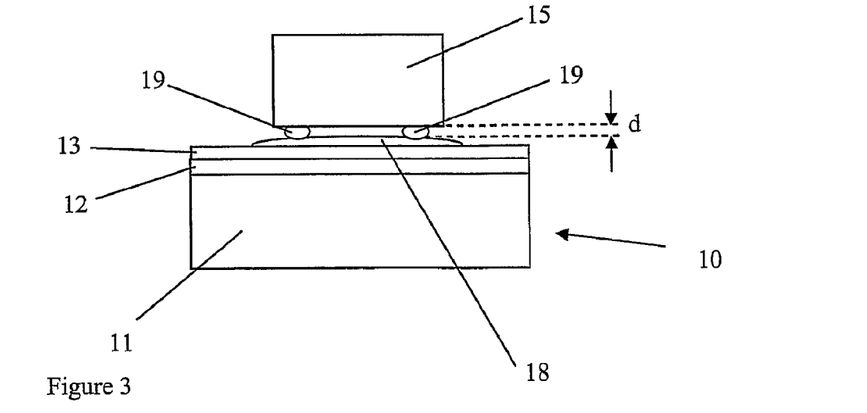
FIG. 3 is a schematic cross-section of part of the connector of FIG. 1.

FIG. 3 is a schematic cross-section of a single connector foot 15 mounted on the glazing 10. A pair of protrusions or dimples 19 are provided on the base of the connector foot 15, each having a height d. The protrusions 19 ensure that the main body of the foot 15 is kept at a set height above the bus bar 13. In use, the layer of solder 18 will completely surround the protrusions 19 and contact the base of the connector foot 15, but this is omitted from FIG. 3 for clarity.

The electrical connector 14 may be soldered to the bus bar using various techniques, including hot air, hot iron and resistive heating. The typical soldering time is between 1 and 3 seconds, with 2 to 4 seconds cooling time. During soldering of the connector feet 15 to the bus bar 13, the region of the glazing material 11 between the feet remains relatively cool compared with the connector bridge 17, which is heated almost to the soldering temperature. This leads to a differential in expansion between the connector bridge 17 and the glazing material 11. As the solder layer 18 sets, the temperature change on cooling for the connector bridge 17 is much greater than for the glazing material 11, leading to a differential in the contraction between the connector bridge 17, and the glazing material 11. This expansion and contraction mismatch leads to the generation of stress in the surface of the glazing material in the region where the solder 18 has been applied. In the region of the glazing material 11 directly underneath the connector foot 15, a tensile stress is produced, whereas in the region of the glazing material 11 underneath the connector bridge 17, a compressive stress is produced. Any flaw at the glazing material surface produces a region of high tensile stress.

Figure 4:
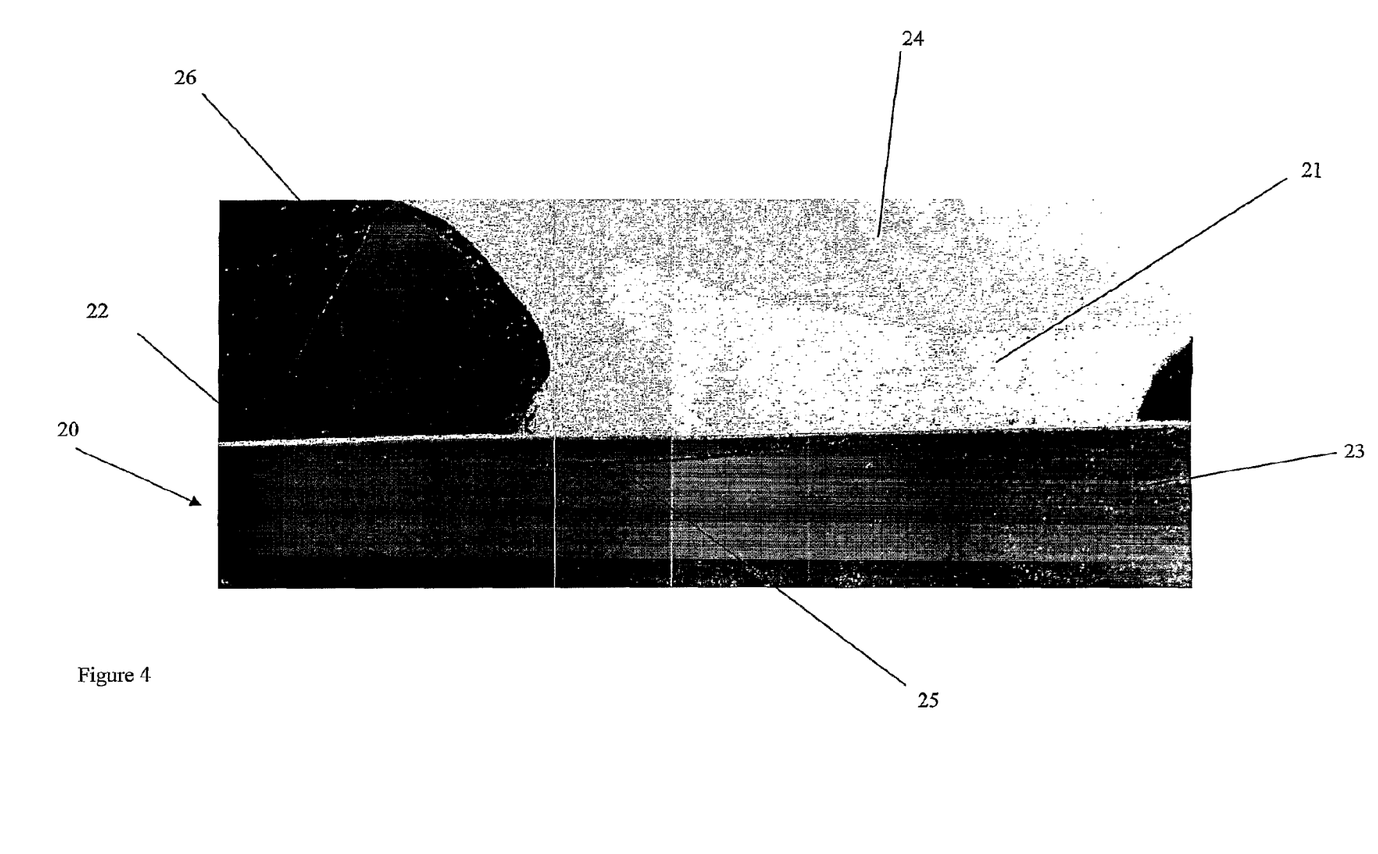
FIG. 4 is a photograph showing in cross section a crack resulting from a stress fault in the surface of a ply of glass.
Figure 5:
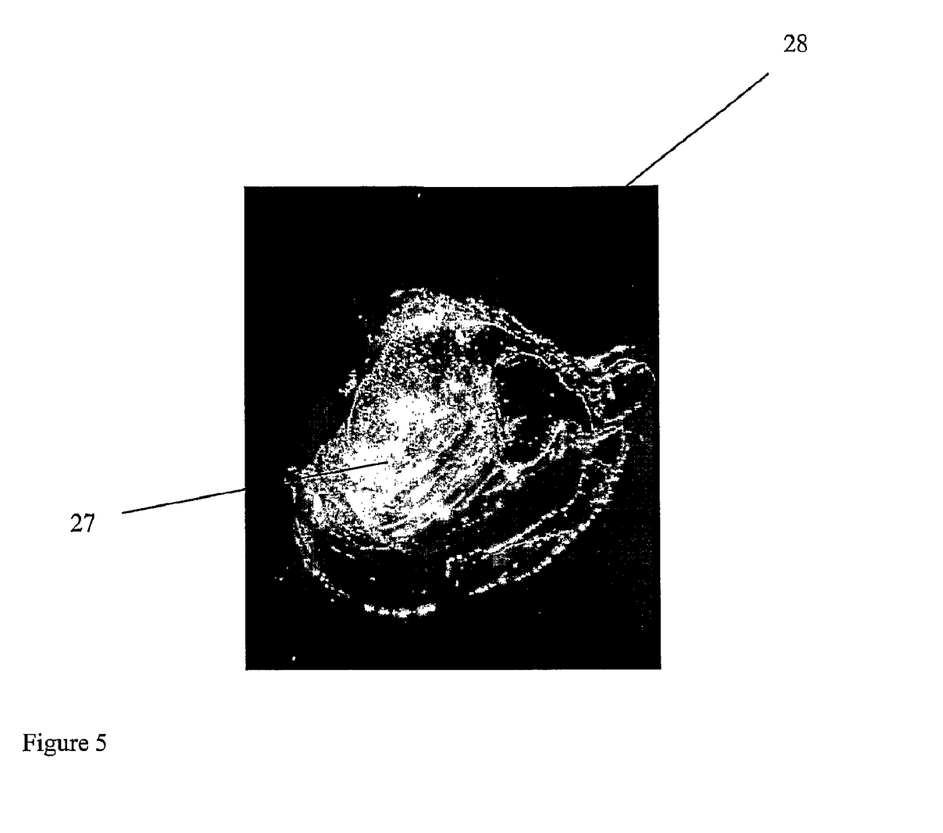
FIG. 5 is a photograph in plan view of a region of the surface of a ply of glass lifted away following cracking.

A typical flaw is illustrated in the photograph in FIG. 4. The photograph shows a cross section of the surface region of an automotive glazing 20 to which an electrical connector (not shown) has been soldered. A region of solder 21 is shown on top of a bus bar 22 on the surface of a ply of glass 23. A stress fault has developed in the surface, at the interface between the glass 23 and the bus bar 22. The connector foot 24 of a T-piece connector is shown soldered to the glazing 20. A crack 25 has developed, travelling roughly parallel with the surface of the glass 23. (An artifact from the sample preparation 27 can also be seen). Such cracking leads to an area of the surface of the glass 23 being removed, as illustrated in FIG. 5. FIG. 5 is a plan view of a fault 27 in the surface of a ply of glass 28, where part of the glass has been lifted away.

Figure 6A:
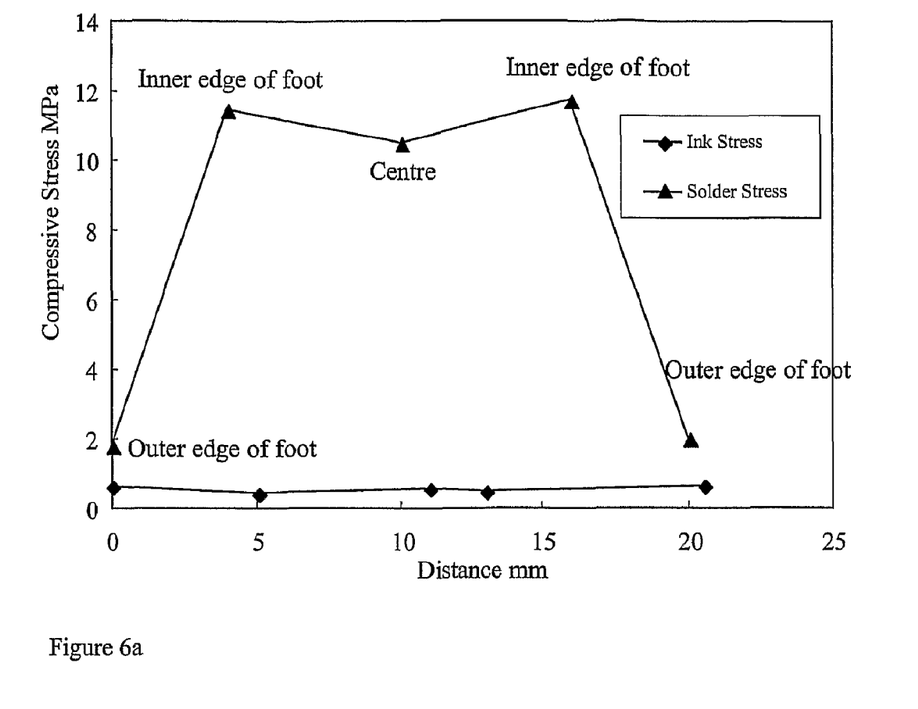
FIG. 6a is a chart illustrating how stress in a ply of glass varies along the length of a connector soldered thereto.
Figure 6B:
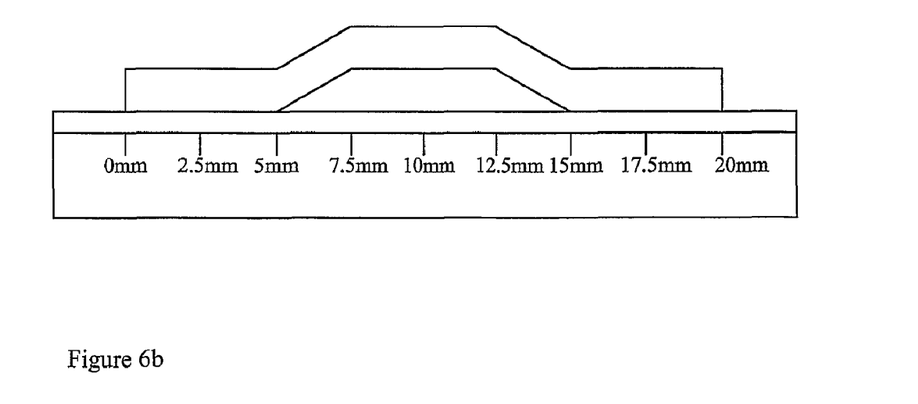
FIG. 6b is a schematic illustration of the scale shown in FIGS. 6a, 7 and 8a to d.

FIG. 6a illustrates how the stress at the surface of a ply of glass varies along the length of the bridge and feet of an electrical connector soldered to a conductive print deposited directly on the surface of the glass. FIG. 6b illustrates the scale used in the measurement, and the relevant positions of the connector feet and bridge. The stress was measured using a Babinet compensator, with the glass sample cut to size and polished in accordance with the requirements of the instrument, immediately after soldering. The maximum stress due to the solder occurs at the inner edge of each connector foot, with a slight decrease at the centre of the connector bridge. There is little difference along the connector in the stress due to the ink.

Once the soldering process is completed, the stress generated in the glass is slowly released over the course of several hours. The fall in the stress (σ) generated within the glass with time (t), after an initial peak, may be described by:

$$\sigma = At^n$$

wherein n is a measure of the creep rate of the solder used, and the pre-exponential factor A is representative of the rate of cooling and differential thermal expansion between the glass and the electrical connector. Creep, which is time dependent, occurs when a solid is exposed to a constant stress, for example when a load acts on a solid from above. The solid will creep (flow) in the direction of the applied stress, causing relaxation. In some instances, the solid will flow beyond its elastic limit, resulting in permanent, plastic deformation.

The stress within the glass is therefore reduced by time, and in accordance with the above equation, by choosing a solder with a particular creep rate. However, rather than considering the properties of the solder used, the present invention seeks to optimise the design of the electrical connector itself. The occurrence of stress is more prevalent in glazings where a lead-free solder has been used. Therefore, the design of the electrical connector should be optimised so that when used with a lead-free solder composition, the stress within the glass approaches the levels seen when used with a lead-containing solder.

In accordance with the present invention, two factors are considered to optimise the design of an electrical connector, to minimise the occurrence of stress faults within the glazing material on which the connector is mounted:
    a) the thickness of the metal forming the connector t; and
    b) the height of the connector bridge h.

Metal Thickness

Figure 7:
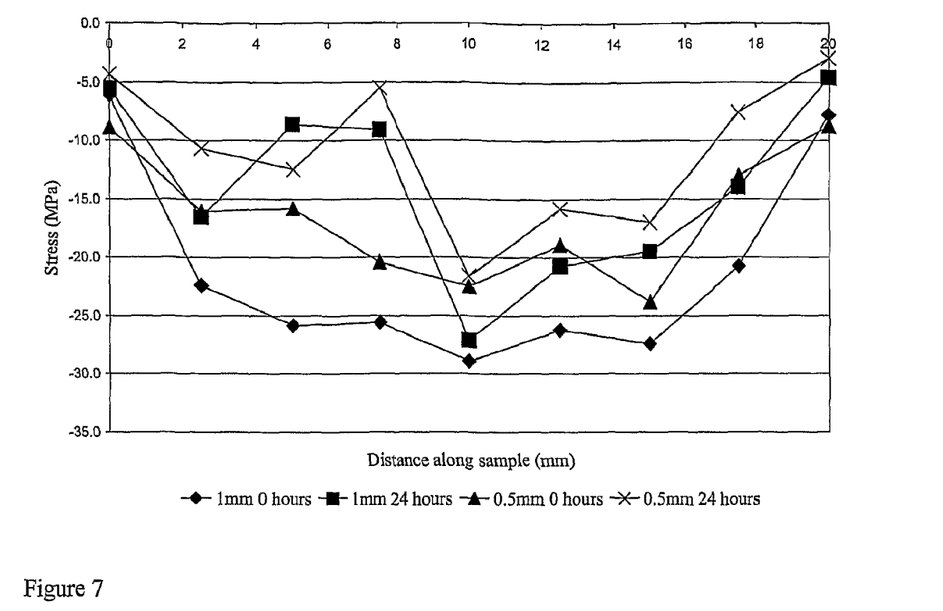
FIG. 7 is a chart showing the stress along the length of various connector samples immediately after soldering and 24 hours after soldering.
Figure 8A:
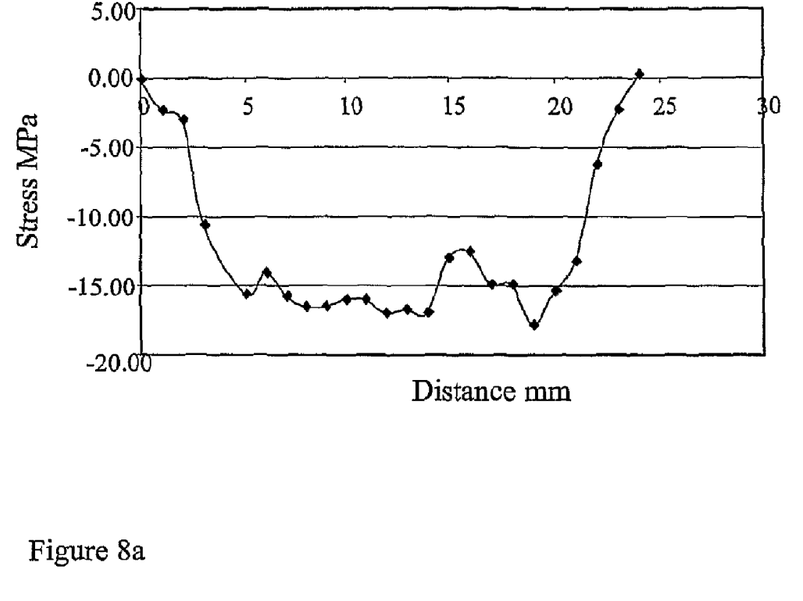
FIGS. 8a, 8b, 8c and 8d are charts illustrating the variation in stress in a ply of glass for different connector bridge heights.
Figure 8B:
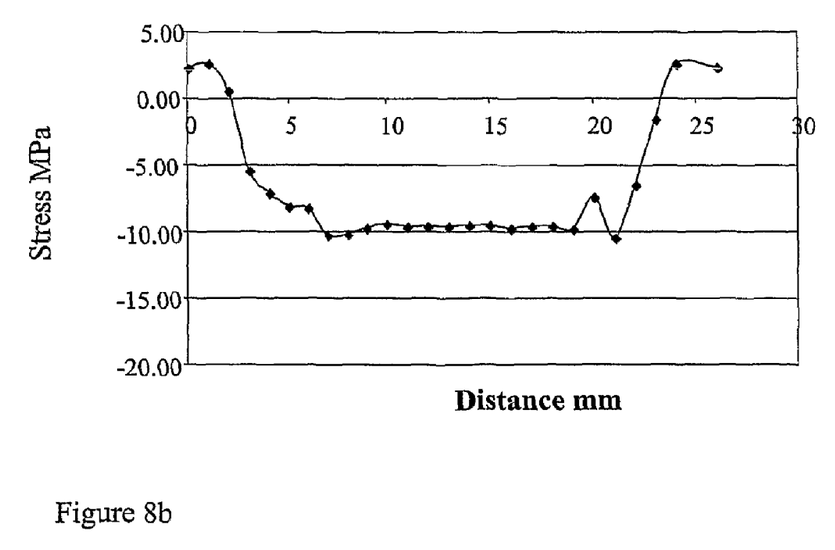
Figure 8C:
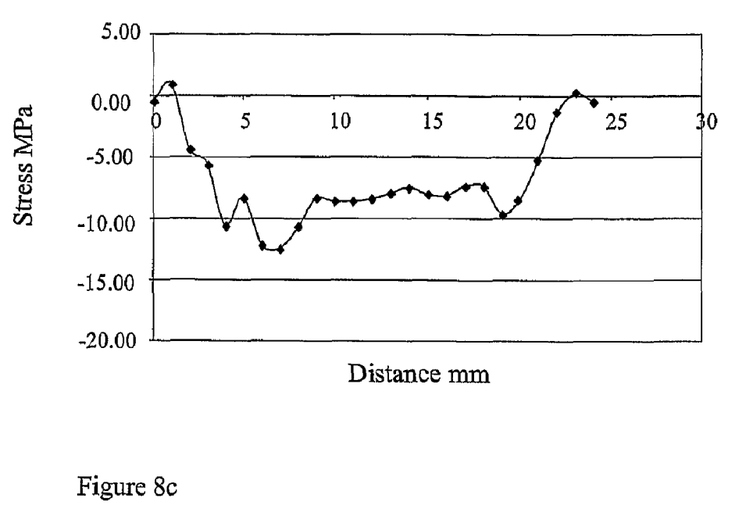
Figure 8D:
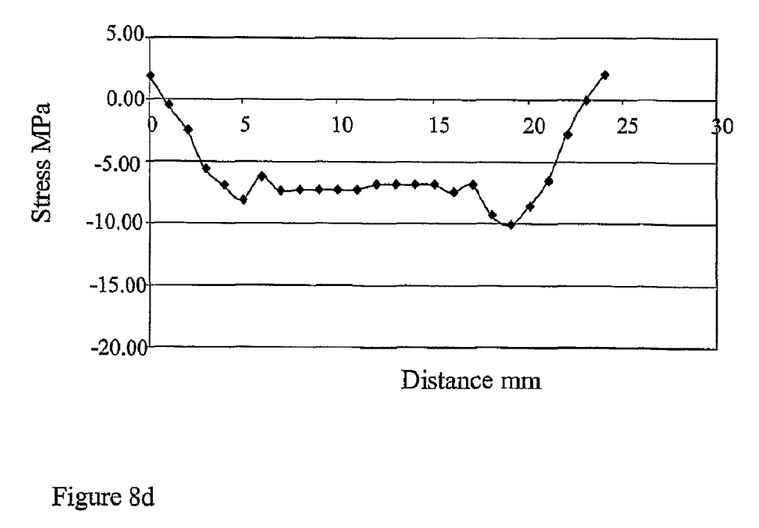

To determine the effect of metal thickness, connector samples formed from copper strips having a nominal thickness of 0.5 nm and 1 mm, and a bridge height of 1 mm, were soldered to flat glass samples, 4 mm in thickness. As it is not possible to measure the stress for connectors soldered onto actual glazings, such as backlights, each test was carried out on connectors mounted on flat glass samples. The stress behaviour of the two metal thicknesses was then studied, and the measurements used as a guide to the behaviour of conventional connectors, where the measured stress would be correspondingly lower. FIG. 7 is a chart showing the variation of stress within a ply of glass for various metallic connectors, each having a different thickness, measured along the scale shown in FIG. 6b, using a Babinet compensator. The solder used had a composition of 42 wt % tin, 57 wt % bismuth and 1 wt % silver, (available from available from Indium (UK), 7 Newmarket Court, Kingston, Milton Keynes, MK10 0AG). Stress measurements were taken immediately after soldering, and 24 hours after soldering, and the samples were kept at room temperature between measurements.

FIG. 7 is a chart showing the stress along the length of the connector samples immediately after soldering and 24 hours after soldering. After soldering, the stress within the samples begins to relax, and decreases until a final, steady value is reached. As shown in FIG. 8, the stress measurements for the 0.5 mm thick material were lower both immediately after soldering and after 24 hours had elapsed. From this, it can be determined that the thickness of the metal forming the connector should be as thin as possible whilst maintaining its structural integrity. Preferably, t should be in the range 0.1 mm to less than or equal to 1 mm, more preferably, 0.1 mm to less than or equal to 0.5 mm.

Height of the Connector Bridge

FIGS. 8a, 8b, 8c and 8d are a series of graphs showing the stress in a ply of glass along the connector, as shown in FIG. 6b, and measured using a Babinet compensator, for four connectors having different bridge heights. A lead containing solder having a composition comprising 25 wt % tin, 62 wt % lead, 3 wt % silver and 10 wt % bismuth, available as above, was used to solder the connector to a bus bar (SP1876 silver ink available from Ferro A G, Gutleustrasse 215, PO Box 110403, D-60039, Frankfurt-am-Main, Germany) printed onto an obscuration band (IT57M202 ceramic ink, available from Johnson Matthey, Fregatweg 38, 6222 NZ Maastricht, The Netherlands), on 4 mm thick clear glass. The glazing was toughened after printing and before soldering.

As described above, the height of the bridge h, is defined as the distance between the bottom of the bridge and the base of the connector feet. FIG. 7a shows stress for a bridge height of 0.5 mm, FIG. 7b for a bridge height of 1.0 mm, FIG. 7c for a bridge height of 1.5 mm and FIG. 7d for a bridge height of 2.0 mm. Therefore, increasing the bridge height reduces the stress in the glazing material. Preferably, the bridge height is within the range 1.0 mm to 5.0 mm, with the upper range only limited by factors including connector feeding and space restraints.

The same relationship (decreasing stress within increasing bridge height) can also be expected for lead-free solders. Modelling work carried out using the parameters in Table 1 was used to confirm the stress behaviour of various bridge height samples using lead-free solder.

TABLE 1

Modelling parameters

|  | E (GPa) | $\alpha$ (1 × 10$^{-6}$) | Density (kg/m$^3$) |
|---|---|---|---|
| Copper | 117 | 17 | 8900 |
| Solder | 30 | 24 | 8400 |
| Glass | 68 | 85 | 2500 |

(E = Young's Modulus, $\alpha$ = Coefficient of Expansion)

The thickness of the copper was nominally 0.8 mm, the glass thickness (flat glass) 4 mm and the solder thickness 3 mm. The type of solder was not specified, and generic thermal and mechanical properties were used in the modelling process. The temperature change was 250° C.

The stress resulting from three different bridge heights was measured, as shown in Table 2:

TABLE 2

Maximum stress for each bridge height h

| Bridge Height h (mm) | Maximum Stress (MPa) |
|---|---|
| 1.2 | 48.6 |
| 1.7 | 42.1 |
| 2.2 | 38.7 |

Again, the stress decreases as the bridge height increases, leading to the same conclusions as the experimental results for the lead-containing solder above. Preferably, therefore, for lead-free solders, the bridge height h is in the range 1.0 mm to 5.0 mm, with the upper value of this range only limited by factors including connector feeding and space restraints. Preferably, the maximum stress measured, when the connector is mounted on a piece of flat float glass is 12 MPa. From the above modelling results, this leads to a bridge height of approximately 4.7 mm.

In order to optimise the design of the electrical connector, at least one of metal thickness or bridge height may be used to minimise the occurrence of stress faults within the glass in the region of the solder. Preferably, both metal thickness and bridge height should be optimised together. By altering and optimising each of these, it is possible to produce a T-piece design, which in conjunction with a lead free solder, results in stress levels within the glass similar to or better than those produced when a lead-containing solder is used.

The invention claimed is:

1. A glazing comprising a ply of glazing material having a first electrically conductive component formed from an electrically conductive silver-containing ink mounted thereon, and an electrical connector, joined to the first electrically conductive component by a lead-free solder, the electrical connector formed from a copper strip having a thickness t and comprising first and second connector feet linked by a bridge portion, the bridge portion being at a height h above the base of each of the connector feet, wherein t is in the range 0.1 mm to less than or equal to 1.0 mm and h is in the range 1.0 mm to less than or equal to 5.0 mm wherein at least one of t or h are chosen to minimise the occurrence of stress faults in the glazing material in the region of the solder such that when the electrical connector is mounted on a piece of flat glass, t and h are chosen such that the maximum stress achieved is less than or equal to 12 MPa.

2. The glazing of claim 1, wherein both t and h are chosen to minimise the occurrence of stress faults within the glazing material.

3. The glazing of claim 1, wherein the first electrically conductive component is a busbar.

4. The glazing of claim 1, wherein the surface of the ply of glazing material is printed around its periphery with a fired ink band.

5. The glazing of claim 4, wherein at least part of the first electrical component is provided on the fired-ink band.

6. The glazing of claim 5, wherein the glazing material is a ply of toughened glass, and the stress fault manifests itself as a blister in the fired-ink band and corresponding region of the glass.

7. The glazing of claim 6, wherein the glazing material is a ply of annealed glass included in a laminate, and the stress fault manifests itself as one or more cracks therein.

8. The glazing of claim 1, wherein the stress fault manifests itself as a structural defect in the interface between the first electrically conductive component and electrical connector.

9. The glazing of claim 1, wherein the electrical connector is a T-piece connector.

10. The glazing of claim 1, wherein the glazing is an automotive glazing.

11. The glazing of claim 2, wherein the first electrically conductive component is a busbar.

12. The glazing of claim 2, wherein the surface of the ply of glazing material is printed around its periphery with a fired ink band.

13. The glazing of claim 3, wherein the surface of the ply of glazing material is printed around its periphery with a fired ink band.

14. The glazing of claim 2, wherein the stress fault manifests itself as a structural defect in the interface between the first electrically conductive component and electrical connector.

15. The glazing of claim 2, wherein the electrical connector is a T-piece connector.

16. The glazing of claim 2, wherein the glazing is an automotive glazing.

* * * * *